United States Patent [19]

Howard

[11] Patent Number: 4,709,369
[45] Date of Patent: Nov. 24, 1987

[54] POWER CONTROL SYSTEM FOR CONTROLLING THE POWER OUTPUT OF A MODULATED LASER DIODE

[75] Inventor: Peter G. Howard, Junction City, Oreg.

[73] Assignee: Spectra-Physics, Inc., San Jose, Calif.

[21] Appl. No.: 746,171

[22] Filed: Jun. 18, 1985

[51] Int. Cl.⁴ ............................ H01S 3/10; H01S 3/13
[52] U.S. Cl. ....................................... 372/38; 372/26; 372/31
[58] Field of Search ........................ 372/38, 29, 26, 31; 250/305

[56] References Cited

U.S. PATENT DOCUMENTS 4,594,717  6/1986  Bracht et al. .......................... 372/38

OTHER PUBLICATIONS

Malvino, *Electronic Principles* Third Edition, pp. 375-376, McGraw-Hill Book Company.

*National Semiconductor* Operational Amplifiers/Buffers" pp. 3-125 and 3-149.

Primary Examiner—James W. Davie
Attorney, Agent, or Firm—Donald C. Feix; Paul Davis

[57] ABSTRACT

A power control system for controlling the power output of a modulated laser diode receives current pulses of a signal to be evaluated and establishes a DC voltage which represents the peak value of the light pulses out of the laser diode. An integrator feedback loop compares the desired power with the established DC voltage representing the peak value and causes the laser diode to make light pulses at the correct value. The control system includes a sample and hold which is constructed to act in association with the integrator feedback loop to perform at a rate in all substantial respects as if the modulated, chopped light output of the laser diode were continuously on and to produce in a symmetric manner effective control in real time both for an increase and for a decrease in the signal to be evaluated.

4 Claims, 2 Drawing Figures

4,709,369

POWER CONTROL SYSTEM FOR CONTROLLING THE POWER OUTPUT OF A MODULATED LASER DIODE

THE BACKGROUND OF THE INVENTION

This invention relates to a control system for controlling the power output of a modulated laser diode.

It relates particularly to a control system for controlling the power output of a laser diode of the kind used in printers where the modulation of the light output may be 100% modulation between full on and full off and where there is a need to keep stable the value of the current needed to turn the laser diode on to the desired power level after relatively long periods of time when the laser diode is off and during which long periods of time no updating information is generated for the power control system.

In a printer environment a laser diode is usually modulated between a full on and a full off condition and may be required to produce a single pixel of light followed by a relatively long period in the full off condition before being modulated to another on condition.

A laser diode is a current control device that has poor long time stability characteristics. The stability characteristics vary with temperature and with age of the laser diode. For these reasons, the laser diode always has to be actively controlled.

The modulation of a laser diode in a printer is determined by the printing content. It is necessary to take and to sample the light every time the light is turned on. The sample is held electronically so that the changes in the modulation pattern do not affect the output of the error signal of the control.

The control must respond within a reasonable time both to an increase and to a decrease in the signal to be evaluated in order to provide effective control of the power output of the laser diode.

SUMMARY OF THE INVENTION

It is a primary object of the present invention to construct a power control system for controlling the power output of a modulated laser diode of the kind used in printers where the modulation of the light output may be 100% modulation between full on and full off.

It is another important object of the present invention to construct the power control system with a minimum of implementation and in a way that the control system will be effective to keep stable the value of the current needed to turn the laser diode on to the desired power level after long periods of time when the laser diode is off.

Another important object is to construct the control system to function in a symmetric way so that the power system will respond quickly both to an increase and to a decrease in the signal to be evaluated.

A power control system constructed in accordance with a specific embodiment of the present invention includes set power means for producing a DC voltage demand signal representing the diode power output that is desired to be produced.

Conditioning means receive from a sense diode of the laser diode current pulses of a signal to be evaluated. The conditioning means are effective to establish a DC voltage which represents the peak value of the light pulses out of the laser diode independent of the modulation pattern of the light pulses.

An integrator feedback loop compares the desired power with the output from the conditioning means and establishes an output current which causes the laser diode to make light pulses of the correct value.

The conditioning means include sample and hold means which are constructed to act in association with the integrator feedback loop to perform at a rate in all substantial respects as if the modulated, chopped output of the laser diode were continuously on.

The sample and hold means produce effective control of the power output in real time (so far as human perception is concerned) for both an increase and a decrease in the signal to be evaluated.

Power control system apparatus and methods which incorporate these features described above and which are effective to function as described above constitutes further, specific objects of the invention.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

DESCRIPTION OF THE PREFERRED EMBODIMENTS

Figure 1:
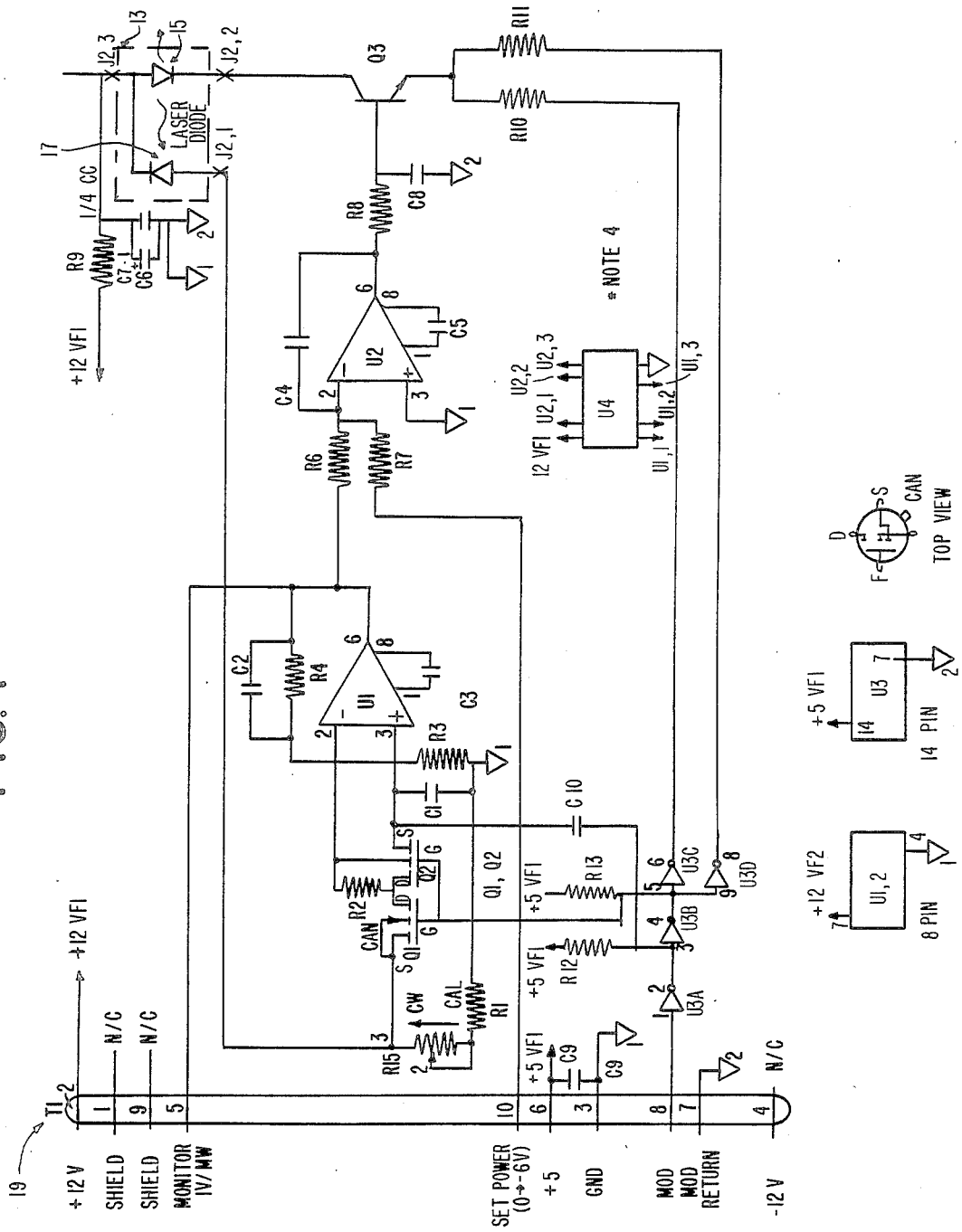
FIG. 1 is a view of a power control system for controlling the power output of a modulated laser diode and constructed in accordance with one embodiment of the present invention.

In FIG. 1 a power control system for controlling the power output of a modulated laser diode and constructed in accordance with one embodiment of the present invention is indicated generally by the reference numeral 11.

The system 11 includes a laser diode package 13.

The laser diode package 13 includes a diode 15 which produces the light output to be used by a printer or other mechanism.

The diode package 13 also includes a sense diode 17 which is a photoconductive diode. The sense diode 17 supplies a pulse signal which is a measure of the power produced in the diode 15.

The modulation of the laser diode 15 is under the control of a switching transistor Q3. In the application illustrated in FIG. 1 where the laser diode is used in a printer, the modulation produced by the switching transistor Q3 is 100% modulation. The laser diode 15 is either full on or full off.

In FIG. 1 transistors are represented by the letter Q and a number to designate the particular transistor, resistors are indicated by the letter R followed by a number for the particular resistor, capacitors are represented by the letter C followed by a number for the particular capacitor, and amplifiers are indicated by the letter U followed by a number for the particular amplifier.

The small, separate figures which are on the same sheet as FIG. 1 show pin connections for the elements referenced by the same letters and numbers as in FIG. 1.

Continuing with a description of FIG. 1, the system 11 includes a power and control bus 19. The power supply and control functions are indicated by the numbers and the letters at the left hand side of the bus 19.

The monitor function is, in the particular embodiment of the system shown in FIG. 1, used primarily only for an initial, field setting of the system.

The modulation (the turning on or turning off of the diode 15 through the transistor Q3 as discussed above) is accomplished by the line 8 indicated by "MOD" to the left of the bus 19.

The desired power at which the laser diode 15 is to operate is set by the set power setting on line 10 of the bus 19. This is the demand signal which is supplied to the integrator U2 in the manner indicated in FIG. 1.

The laser diode is a current control device that has poor longtime stability characteristics. The current flowing through a laser diode varies with temperature and varies as the laser diode ages. For these reasons, the current and power output of the laser diode always has to be actively controlled.

In the system shown in FIG. 1 the modulation of the laser diode is more or less random because it is used in a printer with a format and the modulation is determined by the printing content.

To control the power output of the laser diode 15 effectively, the control system of the present invention takes a sample of the light every time the light is turned on. This sample is held electronically so that the changes in the modulation pattern do not affect the output of any signal produced by the integrator U2.

In the control system of the present invention the output of the sense diode 17 is transmitted to the resistor R15 which is a calibration potentiometer.

There is a large variation of light output in production laser diodes, so to calibrate the system effectively at, say one volt per milliwatt, a control is put in the resistor 15 for establishing the correct voltage of U1.

The resistor R15 makes a voltage pulse equivalent to the power output of the sense diode 17 and power output diode 15 (because the power output of the sense diode 17 is, for all intents and purposes, the power output of the diode 15).

The voltage pulse from the resistor R15 is supplied to a sample and hold which comprises two field effect transistors Q1 and Q2 connected in series as illustrated. The field effect transistor switches Q1 and Q2 put that voltage on a sampling capacitor C1 and then leave it there as a sample and hold.

The DC voltage that results at the output U1 is the steady state amplitude of the light pulses. This steady state amplitude is compared with the demand signal (from the set power line 10 at the summing junction of the integrator U2). The output of the integrator U2 drives the switching current source U3 which drives the laser.

In this way, under closed loop considerations, the current integrates up to a value which satisfies the balance of the summing junction of the integrator U2 so that the integral term is effective in a very over damped control loop with a sample and hold mechanism to make the changing data pattern stable. The loop performs, for low frequencies and in the few hundred cycles existing in the printer environment, as with a normal DC loop. With the minimum refresh rate of the laser printer establishing a nyquist frequency, the system never sees the influence of the control as being a sample data system.

It is an important feature of the present invention that the control system is symmetrical for power levels that go down as well as go up. A sampling capacitor will track quite well for power that goes up, but when a set power control is adjusted to turn the power down, the mechanism that takes the charge off of the sampling capacitor is significantly slower, in the usual case, than the mechanism that puts the charge on the capacitor. For that reason, as the power is turned down, it can take, literally, 20 to 30 seconds to produce an actual reduction in the power output if the sample and hold is not constructed to be symmetrical and to respond as quickly for a reduced power setting as it does for an increased power setting.

In the present invention two field effect transistors (FET) Q1 and Q2 are connected in series as illustrated in FIG. 1 with the first FET (Q1) having its source and substrate connected to the input of the current pulses and with the second FET (Q2) having its source connected to the sampling capacitor C1 and having its substrate connected to the inverting amplifier (U1) input.

The junction of the two FETS is connected into a larger resistor R2 which is driven by the output of an amplifier U1 to a value equal to the voltage stored on the sample and hold capacitor. This provides a stable control voltage during changing data patterns which enables easy implementation of an overdamped control loop which behaves very much in the same manner as a DC control loop.

Figure 2:
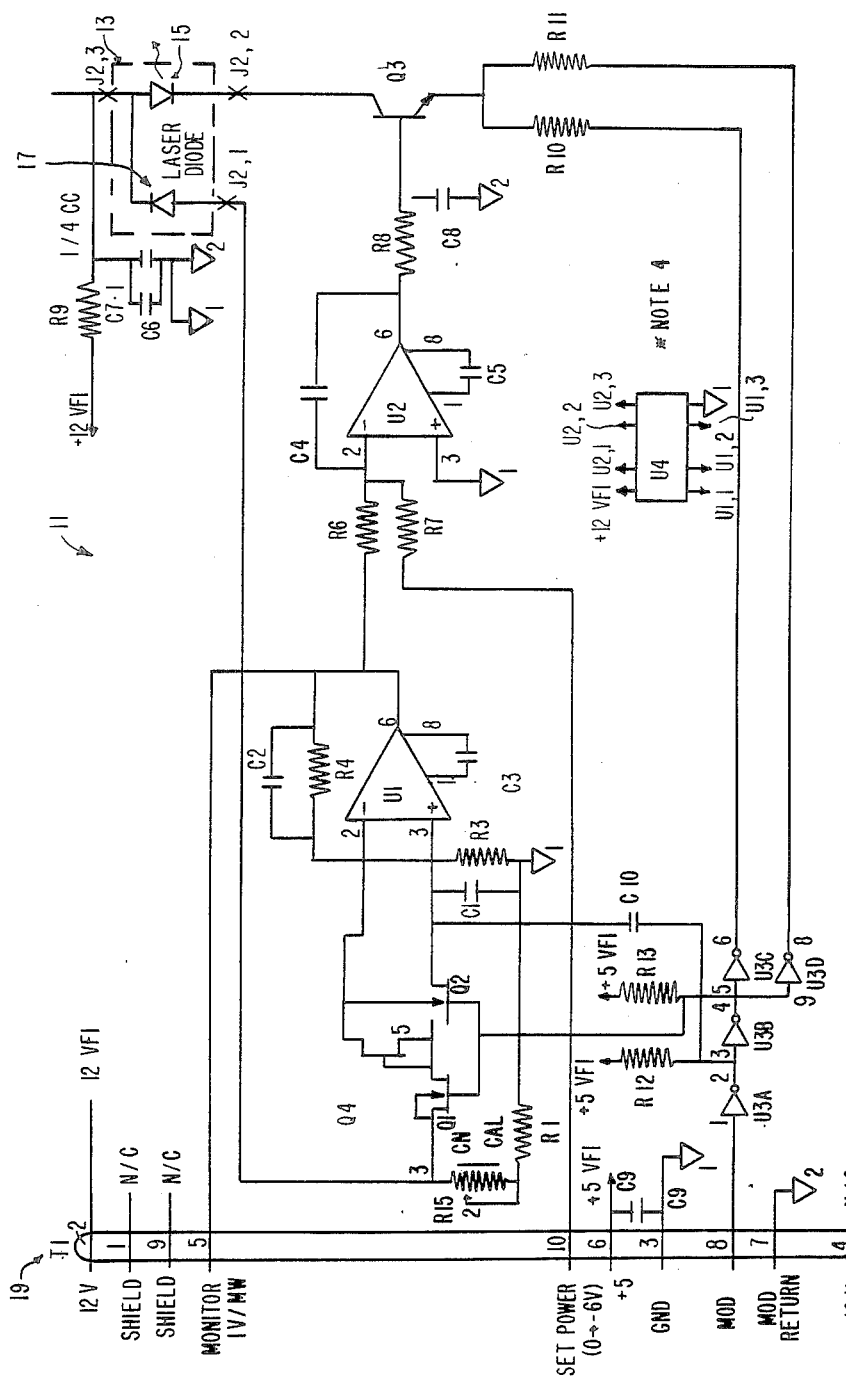
FIG. 2 is a diagram showing an alternate embodiment of the invention.

In another embodiment of the present invention shown in FIG. 2, the junction of the two FET switches Q1 and Q2 is connected to a third FET switch. This eliminates the need for the resistor R2. Eliminating a resistor is preferred for purposes of integrated circuit design because resistors are not very desirable in integrated circuits.

In either case, the control (as shown with the resistor R2 or with a third FET switch replacing the resistor R2 as described above) of the present invention is symmetrical so that if the peak value changes very quickly the control gets to the final value up or down at the same rate. Everytime the switch is closed, the sampling capacitor C1 will charge up exponentially or charge down exponentially at the rate which is the exponential function of the time constant C times R. In the present invention the switch closes and C goes to the new value for the signal to be evaluated.

In the actual requirements for one specific embodiment of the system shown in FIG. 1 it was desired to be able to reach 95% of the peak value of the signal to be evaluated within one second. The stored sample of the light on the sampling capacitor C1 can be produced to essentially 100% of its value in one pixel which is 475 nanoseconds. So the control system shown in FIG. 1 adjusts the power up and down at a constant rate and very quickly and well within the requirements of a printer environment.

Another requirement for a printer application for the system shown in FIG. 1 is to be able to keep the current stable in the laser diode for long periods of time when there is no updating of the information. The integrator time constant and the sample and hold mechanism of the present invention enable this to be achieved. The double switch sample and hold of the present invention copes very effectively with a circumstance in which one single pixel of the laser turned on (which is 475 nanoseconds) is followed by a long period of time when the laser diode is off and during which long period of time there is no update of information generated for the power control system. To accomplish this function the voltage stored on the sampling capacitor C1 essentially must not decay at all during this long period of time. To do this and to have a small enough capacitor to be able to acquire the charge in 475 milliseconds means that there must be very low leakage of the connectors to the capacitor C1. Using the second FET switch Q2 connects the drain of Q1 to the non-inverting input of the amplifier U1 which is forced by the feedback action to be within the offset voltage, the same value as the voltage on the sampling capacitor C1. This means that the FET switch Q2 has essentially zero voltage across it and therefore there is no leakage from the capacitor C1. When both switches are opened it removes the leakage current.

The control system of the present invention is effective to respond quickly to changing levels of the signal to be evaluated both in an increasing and in a decreasing direction, and the control system of the present invention is effective to maintain effective control for operation of the laser diode at the desired power output level even after the laser diode has been modulated off for an extended period of time.

Looking at the control system in operational terms, the control system includes set power means for producing a DC voltage demand signal representing the laser diode power output that is desired to be produced. This is the set power control on line 10.

The control system includes conditioning means for receiving current pulses of a signal to be evaluated from a sense diode of the laser diode, and these conditioning means are effective to establish a DC voltage which represents a peak value of the light pulses out of the laser diode independent of the modulation pattern of the light pulses. These conditioning means include the resistor R15, the FET switches Q1 and Q2, the sampling capacitor C1 and the inverting amplifier U1.

The control system includes integrator feedback loop means for comparing the desired power with the output from the conditioning means and for establishing an output current which causes a laser diode to make light pulses of the correct value. This integrator feedback loop means include the integrator U2 which controls the operation of the FET switch Q3.

The conditioning means include sample and hold means which act in association with the integrator feedback means at a rate to perform in all substantial respects as if the modulated, chopped light output of the laser diode were continuously on, and the sample and hold means act in association with the integrated feedback means to produce in a symmetric manner effective control in real time (as far as human perception is concerned) both for an increase and for a decrease in the signal to be evaluated.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. A power control system for controlling the power output of a modulated laser diode of the kind used in printers where the modulation of the light output may be 100%. modulaton between full on and full off and of the kind where there is a need to keep stable the value of the current needed to turn the laser diode on to the desired power level after relatively long periods of time when the laser diode is off and during which long periods of time no updating informaton is generated for the power control system, said power control system comprising,
    set power means for producing a DC voltage demand signal representing the laser diode power output that is desired to be produced,
    a sense diode associated with and connected to the laser diode,
    conditioning means for receiving current pulses of a signal to be evaluated from the sense diode and for establishing a DC voltage which represents the peak value of the light pulses out of the laser diode independent of the modulation pattern of the light pulses, the signal from the sense diode being a measure of the power produced in the laser diode,
    integrator feedback loop means for comparing the desired power with the output from the conditioning means and for establishing an output current which causes the laser diode to make light pulses of the correct value, and
    wherein the conditioning means include sample and hold means for acting in association with the integrator feedback means at a rate to perform in all substantial respects as if the modulated, chopped light output of the laser diode were continuously on and for producing in a symmetric manner effective control in real time both for an increase and for a decrease in the signal to be evaluated.

2. The invention defined in claim 1 wherein the sample and hold means include a sampling capacitor, an inverting amplifier and two field effect transistor (FET) switches employed in series back to back with the first FET having its source and substrate connected to the input of the current pulses and with the second FET having its source connected to the sampling capacitor and its substrate connected to the inverting amplifier input.

3. The invention defined in claim 2 wherein the junction of the two FETS is connected into a large resistor which is driven by the output of an amplifier to a value equal to the voltage stored on the sample and hold capacitor.

4. The invention defined in claim 2 including a third FET and wherein the junction of the two series connected FETS is connected to the third FET to eliminate the need for a resistor in association with the junction.

* * * * *